United States Patent [19]

Son

[11] Patent Number: 5,789,266
[45] Date of Patent: Aug. 4, 1998

[54] METAL OXIDE SEMICONDUCTOR FIELD EFFECT TRANSISTOR (MOSFET) FABRICATION METHOD

[75] Inventor: Jeong-Hwan Son, Daejon, Rep. of Korea

[73] Assignee: LG Semicon Co., Ltd., Choongcheongbuk-Do, Rep. of Korea

[21] Appl. No.: 789,101

[22] Filed: Dec. 27, 1996

[30] Foreign Application Priority Data

Dec. 29, 1995 [KR] Rep. of Korea ............ 67321/1995

[51] Int. Cl.⁶ .................................................. H01L 21/265
[52] U.S. Cl. ....................................... 437/45; 437/239
[58] Field of Search ............................ 437/44–45, 239

[56] References Cited

U.S. PATENT DOCUMENTS 5,231,038  7/1993  Yamaguchi et al. ................ 437/40
5,599,728  2/1997  Hu et al. ............................ 437/44
5,605,855  2/1997  Chang et al. ...................... 437/45

*Primary Examiner*—John Niebling
*Assistant Examiner*—Richard A. Booth

[57] ABSTRACT

A MOSFET fabrication method which is capable of enhancing the reliability of a MOSFET by improving a short channel effect of a MOSFET, which includes the steps of forming an oxide possible film on a first buffer film on a substrate, isotropic etching the oxide possible film for exposing a portion of the first buffer film, forming a second buffer film by oxidizing the entire front surface of the substrate in order for the entire surface of the oxide possible film to be oxidized, forming a recess shape channel region formed in the substrate by a channel ion implantation into the resultant structure by using the second buffer film as a mask, removing the second buffer film, forming a gate on the channel region of the substrate, and forming a dopant ion implantation region in the substrate formed at both sides of the gate.

4 Claims, 2 Drawing Sheets

METAL OXIDE SEMICONDUCTOR FIELD EFFECT TRANSISTOR (MOSFET) FABRICATION METHOD

BACKGROUND OF THE INVENTION

1. Field of the Invention

The present invention relates to a metal oxide semiconductor field effect transistor (MOSFET) fabrication method, and in particular to an improved MOSFET fabrication method which is capable of enhancing the reliability of a MOSFET by improving a short channel effect of a MOSFET.

2. Description of the Conventional Art

As a high integration semiconductor device is made, the channel length of a transistor and the width thereof are reduced for a device isolation.

Therefore, various methods are used for improving the short channel effects in a lightly doped drain (LDD) MOSFET. In particular, a double ion implantation method and a halo ion implantation method are generally used for improving the threshold voltage roll-off characteristic and the punch-through characteristic.

However, in the case of the double ion implantation method, as in a conventional LDD MOSFET device, a problem occurs in that the source/drain region is count-doped with an ion implantation region formed by the channel ion implantation process or the double ion implantation process. In addition, in the case of the halo ion implantation method, the processes are complicated because a large-angle tilt (LAT) ion implantation process must be repeatedly performed to obtain a desired effect.

FIG. 1 is a cross-sectional view illustrating the construction of a conventional MOSFET which was fabricated in order for the gate to have a recess so as to improve the short channel effect.

In the above-described MOSFET, an oxide film 2 is formed on a region on which a gate is formed by an oxidation process. Thereafter, an LDD ion implantation is performed into the resultant structure. A portion of the oxide film 2 in a gate region except for a bird's beak is etched, and the threshold ion implantation and the channel ion implantation are performed into the resultant structure in order, for thus forming a threshold ion implantation region 3 and a punch-through stopper region 4 which is a channel region. Thereafter, the gate 5 is formed in a portion where the oxide film 2 is etched in order for a portion of the bird's beak to be included. In addition, a high density n-type dopant is ion-implanted by using the gate 5 as a mask, for thus forming n+ source/drain regions 6 and 6'.

Since the MOSFET (the gate of which is recessed) does not have a portion in which the channel ion implantation region and the source/drain ion implantation region overlap, the n+ source/drain regions 6 and 6' are not count-doped with the punch-through stopper region 4. Therefore, it is possible to reduce the junction capacitance of the transistor, and form the source/drain junction deeper, for thus improving the current driving capacity and a drain induced barrier lowering characteristic in cooperation with the recess structure.

Here, the punch-through region 4 is formed for the reasons that the transistor can be operated in a region which the gate can control in order to prevent the current from flowing from the source to the drain where the gate acts as a switch during an operation where the transistor is not turned on (namely, in a state that the channel is not formed).

However, when fabricating the MOSFET in such manner, a lateral doping profile of the channel is constant, for thus reducing the effect of improving the threshold roll-off characteristic, and it is impossible to improve the short channel effects.

SUMMARY OF THE INVENTION

Accordingly, it is an object of the present invention to provide a MOSFET fabrication method which overcomes the problems encountered in the conventional art.

It is another object of the present invention to provide a MOSFET fabrication method which is capable of enhancing the reliability of a MOSFET by improving a short channel effect of a MOSFET.

To achieve the above objects, there is provided a MOSFET fabrication method which includes the steps of forming an oxide possible film on a first buffer film on a substrate, isotropic etching the oxide possible film for exposing a portion of the first buffer film, forming a second buffer film by oxidizing the entire front surface of the substrate in order for the entire surface of the oxide possible film to be oxidized, forming a recess shape channel region formed in the substrate by a channel ion implantation into the resultant structure by using the second buffer film as a mask, removing the second buffer film, forming a gate on the channel region of the substrate, and forming a dopant ion implantation region in the substrate formed at both sides of the gate.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The metal oxide semiconductor field effect transistor (MOSFET) according to the present invention is fabricated so that a lateral doping profile has a non-uniform distribution, for thus improving a short channel effect of the MOSFET.

FIGS. 2A through 2G are cross-sectional views illustrating a fabrication process of a MOSFET according to the present invention.

As shown therein, a first thin buffer film 12, for example, a pad oxide film, is formed on a semiconductor substrate 11, and a polysilicon which is an oxide possible film 13 is formed on the first buffer film 12.

Figure 1:
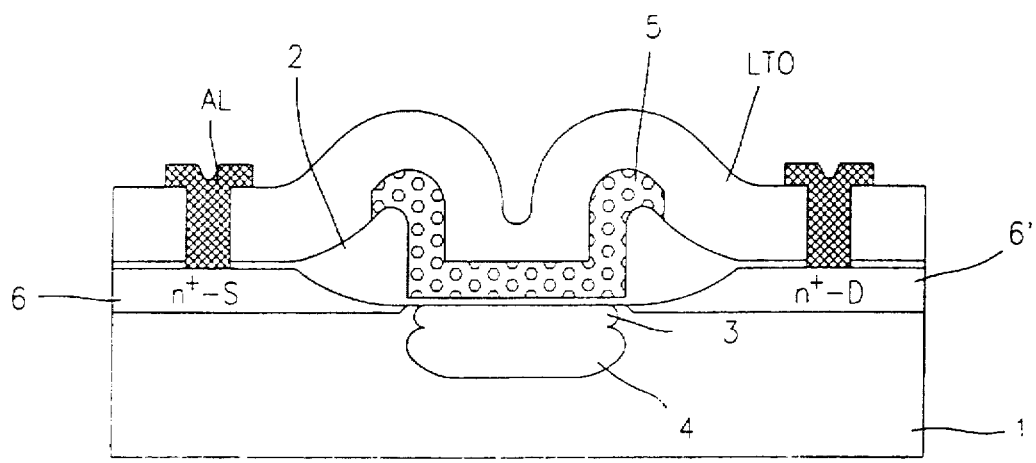
FIG. 1 is a cross-sectional view illustrating the construction of a conventional MOSFET.
Figure 2A:
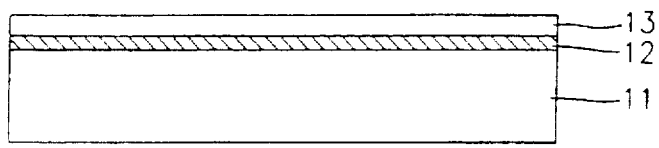
FIGS. 2A through 2G are cross-sectional views illustrating a fabrication process of a MOSFET according to the present invention.
Figure 2B:
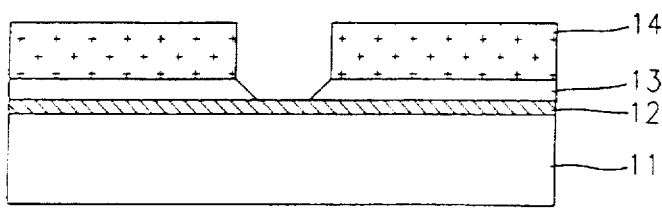

Thereafter, as shown in FIG. 2B, a photoresist pattern 14 is formed on the oxide possible film 13, and the oxide possible film 13 is isotropic wet etched, for partially exposing the surface of the first buffer film 12. The photoresist pattern 14 is there after removed.

Figure 2C:
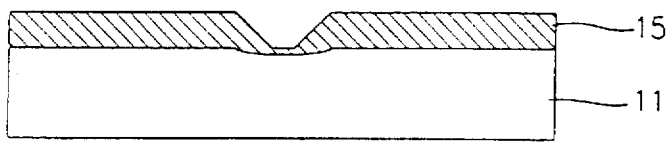

As shown in FIG. 2C, the entire surface of the substrate is then oxidized. As a result, only the polysilicon which is the oxide possible film 13 is oxidized, and the region in which the oxide possible film 13 is not formed is oxidized together with the silicon substrate 11 formed below the first buffer film 12, for thus forming a second buffer film 15 on the substrate 11. Here, since the oxidation rate of the polysilicon which is the oxide possible film 13 is faster than the silicon, the thickness of the oxidized second buffer film 15 is different, thus forming an inclined buffer film in an edge portion of the gate.

Figure 2D:
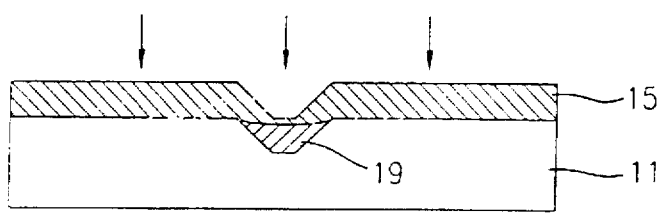

Next, as shown in FIG. 2D, the resultant structure is channel-ion-implanted by using the second buffer film 15 as a mask and by using one selected from the group comprising B, $BF_2$, P, and As, for thus forming a channel region 19 which is recessed in the substrate 11. Here, there occurs a projection range difference of the ion implantation due to the different thickness of the second buffer film 15. The thick portion of the gate edge region of the second buffer film 15 has a higher surface doping density rather than the center portion of the gate.

Figure 2E:
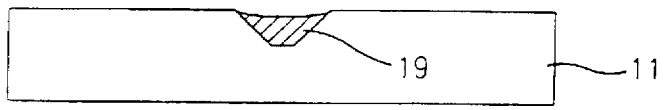
Figure 2F:
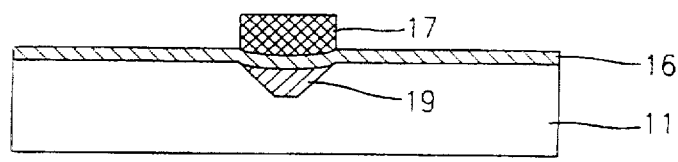

As shown in FIG. 2E, the entire second buffer film 15 is removed, and the gate oxide film 16 is formed on the entire surface of the substrate 11 on which the recessed channel region 19, as shown in FIG. 2F, is formed. Thereafter, the gate 17 is formed on the gate oxide film 16 on the channel region 19.

Figure 2G:
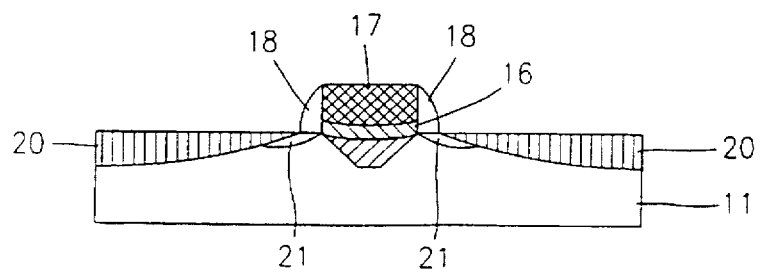

As shown in FIG. 2G, a lightly doped drain (LDD) 21 (which is a low density ion implantation region) is formed in the substrate 11 on both sides of the gate 17 by a lightly doped ion implantation process using the gate 17 as a mask, and a lateral wall spacer is formed in a side wall of the gate 17. Thereafter, a source/drain region 20, which is a high density ion implantation region, is formed in the substrate 11 by using the resultant structure as a mask through a highly doped ion implantation process, and the fabrication processes are finished.

Since the lateral doping profile of the channel is non-uniformly distributed, and the doping density in the edge portion of the gate is high, the threshold voltage roll-off characteristic can be improved. In addition, since the channel is formed in a recess form, the source/drain can have a shallow junction, for thus improving the short channel effect.

As described above, the metal oxide semiconductor field effect transistor fabrication method according to the present invention is basically directed to improving the threshold voltage roll-off characteristic and short channel effects since the channel is formed in a recess form, and the lateral doping profile is non-uniformly formed in order for the surface doping density in the edge portion to be higher than the center portion of the gate.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A metal oxide semiconductor field effect transistor (MOSFET) fabrication method, comprising the steps of:

forming an oxidizable film on a first buffer film on a substrate;

isotropic etching the oxidizable film for exposing a portion of the first buffer film;

forming a second buffer film by oxidizing the entire front surface of the substrate in order for the entire surface of the oxidizable film to be oxidized;

forming a recess shape channel region formed in the substrate by a channel ion implantation into the resultant structure after forming the second buffer film by using the second buffer film as a mask;

removing the second buffer film;

forming a gate on the channel region of the substrate; and forming a dopant ion implantation region in the substrate formed at both sides of the gate.

2. The method of claim 1, wherein said channel ion implantation is performed by using an ion selected from the group consisting of B, $BF_2$, P, and As.

3. The method of claim 1, wherein said oxidizable film is an oxide film.

4. The method of claim 1, further comprising a step for etching the first buffer film the surface of which is exposed and the substrate by a depth after isotropic etching the oxidizable film.

* * * * *